United States Patent
Chen et al.

(10) Patent No.: US 6,559,049 B2
(45) Date of Patent: May 6, 2003

(54) ALL DUAL DAMASCENE OXIDE ETCH PROCESS STEPS IN ONE CONFINED PLASMA CHAMBER

(75) Inventors: Lawrence Chen, Taipei (TW); Chang-Tai Chiao, Hsin Chu (TW); Young Tong Tsai, Fremont, CA (US); Francis Ko, Taichuang (TW); Chuan-Kai Lo, Hsin Chu (TW)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/210,612

(22) Filed: Jul. 31, 2002

(65) Prior Publication Data

US 2003/0032278 A1 Feb. 13, 2003

Related U.S. Application Data

(60) Provisional application No. 60/311,066, filed on Aug. 8, 2001.

(30) Foreign Application Priority Data

Jun. 28, 2002 (TW) ........................................ 91114478 A

(51) Int. Cl.$^7$ .......................................... H01L 21/4763
(52) U.S. Cl. ........................ 438/637; 438/627; 438/638; 438/643; 438/653; 438/700; 438/707; 438/738
(58) Field of Search ................................. 438/622, 624, 438/627, 637, 638, 643, 653, 700, 707, 724, 734, 738, 740, 744

(56) References Cited

U.S. PATENT DOCUMENTS 6,090,304 A * 7/2000 Zhu et al. .................... 438/724
6,410,451 B2 * 6/2002 Nguyen et al. ............. 438/624

* cited by examiner

Primary Examiner—John F. Niebling
Assistant Examiner—Lynne A. Gurley
(74) Attorney, Agent, or Firm—Lam Research Corporation

(57) ABSTRACT

The present invention reveals a semiconductor dual damascene etching process, which uses a confined plasma etching chamber to integrate all dual damascene steps such as via hole etching, photoresist stripping and barrier layer removal which originally performed in various reactors as a continuous procedure in the confined plasma chamber. The confined plasma chamber including a confinement ring surrounding a wafer and an anti-etching upper electrode plate performs the steps mentioned above under clean mode. The present invention can not only reduce the time period required by the semiconductor dual damascene process but also greatly reduce the manufacturing cost.

18 Claims, 12 Drawing Sheets

ALL DUAL DAMASCENE OXIDE ETCH PROCESS STEPS IN ONE CONFINED PLASMA CHAMBER

CROSS REFERENCE TO RELATED APPLICATIONS

This application claims priority of U.S. Provisional Patent Application Serial No. 60/311,066 filed on Aug. 8, 2001 and Taiwanese Patent Application No. 091114478 filed on Jun. 28, 2002.

BACKGROUND OF THE INVENTION (A) Field of the Invention

The present invention relates to a semiconductor dual damascene etching process, and more specifically to a semiconductor dual damascene etching process employing a confined plasma chamber.

(B) Description of Related Art

With the increase of integrity for the integrated circuits, the distance between the metal lines of semiconductor devices is becoming smaller. RC delay caused by the resistance of the lines and the capacitance of the dielectric between the lines becomes the main reason of the delay of signal transmission and limits device speed. Therefore, copper (Cu) lines and the intermetal dielectric (IMD) are continuously being improved for the fabrication of deep sub-micron devices to overcome the increase of parasitic resistance and capacitance caused by narrower line width in advanced process.

The dual damascene process is used to replace the current Al—Cu metal line process, a process of Back-End of Line (BEOL) of the wafer manufacturing, which is used after forming the contact plug on the silicon substrate and may be repeated several times based on the designed number of metal line layers of device. Currently, most large semiconductor fabs in the world are investing substantial manpower and capital to develop the dual damascene process. Thus, the performance and stability of the process will significantly influence the competitiveness for each large semiconductor fab.

Because copper line is difficult to be etched by plasma, most of the copper lines are conducted with dual damascene process, in which the etching process has a very important role. The dual damascene etching process may be categorized by various forming sequences of dual damascene structure. FIG. 1(a) to FIG. 1(d) illustrate the most popular dual damascene etching process, in which a via hole is etched first and the other structures are formed afterward. Referring to FIG. 1(a), first of all, IMD 102, 104 and an etch stop layer 106 of a semiconductor device 10 are etched to form a via hole, i.e. the opening in the IMD 104, in contact with a barrier layer 108. A photoresist layer 114 is patterned as a mask for the following trench etching, and the hard mask 116 originally used to define the via hole exposed to the opening of the photoresist layer 114 is removed. In FIG. 1(b), the IMD 102 is etched until the etch stop layer 106 is reached to form a trench, i.e. the opening in the intermetal dielectric 102. In FIG. 1(c), the photoresist layer 114 is removed. In FIG. 1(d), the barrier layer 108 and the hard mask 116 are etched, inducing the via hole to be in contact with the metal line 112 under the barrier layer 108, and finally the dual damascene structure is completed.

Another dual damascene process shown in FIG. 2(a) to FIG. 2(d) is to form trenches first and then to conduct the following processes. Referring to FIG. 2(a), firstly, a semiconductor device 20 with a trench is provided, which comprises IMD 202, 204, an etch stop layer 206, a barrier layer 208, a metal line 212, and a photoresist layer 214, wherein the opening of the IMD 202 is a trench, and the opening in the photoresist layer 214 is for via hole etching. In FIG. 2(b), the etch stop layer 206 and the IMD 204 are etched until the barrier layer 208 is reached to form a via hole. In FIG. 2(c), the photoresist layer 214 is removed, and a hard mask 216 is formed as a mask for removing the barrier layer 208. In FIG. 2(d), the barrier layer 208 and the hard mask 216 are etched, and then the dual damascene structure is formed.

Besides the dual damascene processes mentioned above, a method that does not need the etch stop layers 106, 206 is shown in FIG. 3(a) to FIG. 3(e). Referring to FIG. 3(a), a semiconductor device 30 comprises an IMD 302, a barrier layer 304, a metal line 306, a hard mask 308 and a photoresist layer 312, wherein the opening in the IMD 302 is a via hole. In FIG. 3(b), the hard mask 308 is etched to define the pattern required by the trench. In FIG. 3(c), the IMD 302 is etched and stopped in the middle of the IMD 302 to form a trench in the upper portion of the IMD 302. In FIG. 3(d), the photoresist layer 312 is removed. In FIG. 3(e), the barrier layer 304 and the hard mask 308 are etched so that the via hole is in contact with the metal line 306.

Most conventional etching chambers employ "polymerized mode" or "dirty mode" during wafer processing, i.e. a polymer layer is deposited on the inner wall surface of the chamber prior to etching. Thus, the polymer layer can prevent the plasma contacting the inner wall of the chamber, so metal contamination from the inner wall can be avoided. In addition, high selectivity for the photoresist can be achieved. Because most of the photoresist in mass production is an organic substance, conventional methods employ a photoresist stripper with oxygen or oxygen plasma, or a mixture solution of thermal sulfuric acid and dioxide water to remove the photoresist. If oxygen plasma is used for photoresist stripping in the etching chamber, the polymer layer will be removed as well. Thus, the above-mentioned processing steps, such as via hole or trench etching, photoresist stripping, barrier layer etching and hard mask removal cannot be performed in the same etching chamber, and have to be conducted respectively in different tools. Normally, the etching process is conducted in vacuum, thus if a wafer have to change the tool, chamber venting, wafer transferring between different tools, chamber pumping and robot moving and wafer standby would cost much time and affect the production throughput.

SUMMARY OF THE INVENTION

The semiconductor dual damascene process in accordance with the present invention in a confined plasma chamber can integrate all the above-mentioned process steps as a continuous procedure, so as to effectively reduce the process time and manufacturing cost. Moreover, the dual damascene process of the present invention is under clean mode, reducing the process instability caused by the "memory effect" of polymerized mode. Therefore, the dual damascene process in accordance with the present invention can mix-run in the same chamber. Also, because there is no polymer residue in the confined plasma chamber, the number of particle and the likelihood of particle occurrence can be minimized so that preventive maintenance (PM) period of the chamber can be extended.

The semiconductor dual damascene etching process of the present invention is applied in a confined plasma chamber, the confined plasma chamber comprising a confinement ring surrounding a wafer, and an anti-etching upper electrode plate. The semiconductor dual damascene etching process comprises the steps of etching at least one IMD layer, stripping a photoresist layer and etching a barrier layer. These steps are all continuously conducted under clean mode in the confined plasma chamber, so that other tools are not needed and the capitals of tool investment can be effectively reduced.

The confinement ring is made of quartz to prevent the inner wall of the chamber from being bombarded by plasma. The upper electrode plate is made of silicon. The quartz is a composition of $SiO_2$, and a normal dielectric layer is a $SiO_2$ also but with a different structure. Thus, during etching, the quartz confinement ring will generate volatile gas, such as CO and $SiF_4$, etc., and the quartz ring is likely to release the oxygen in the $SiO_2$ material, so as to effectively avoid polymer deposition. The C—F based gases usually used in the dielectric etching are provided with relatively high selectivity to silicon, i.e. with very slow etching rate for silicon. Thus, the upper electrode plate is not easily damaged during etching. Moreover, the silicon plate may provide the function of combining the fluoride in the plasma to increase the selectivity during etching.

The present invention can also be applied in a wafer including a silicon-containing photoresist layer, which uses dry etching for patterning the trench as an alternative of the development step in the conventional lithography process and improves insufficient photoresist selectivity problem. Furthermore, if a hard mask is provided in the process, a hard mask removing step has to be added.

DETAILED DESCRIPTION OF THE INVENTION

Figure 1A:
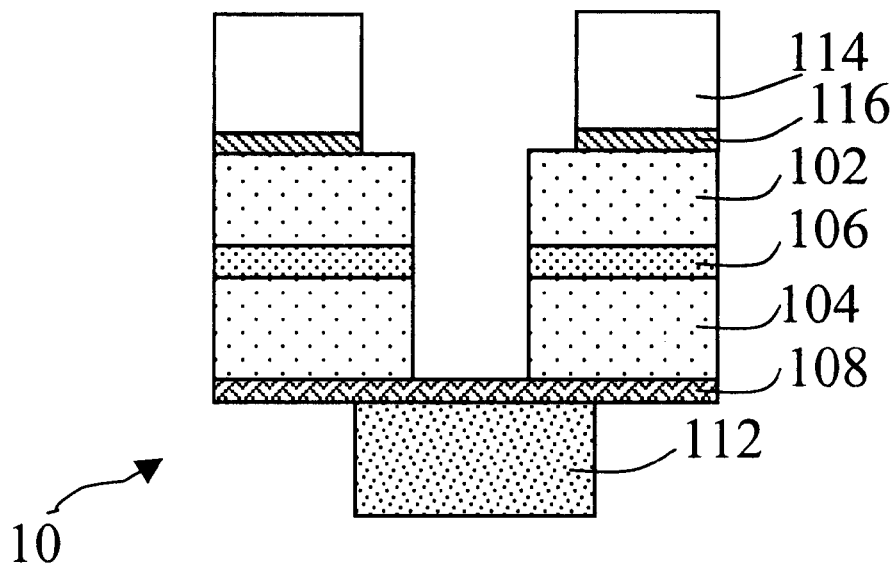
FIG. 1(a) to FIG. 1(d) illustrates a known "via hole first" dual damascene etching process.
Figure 1B:
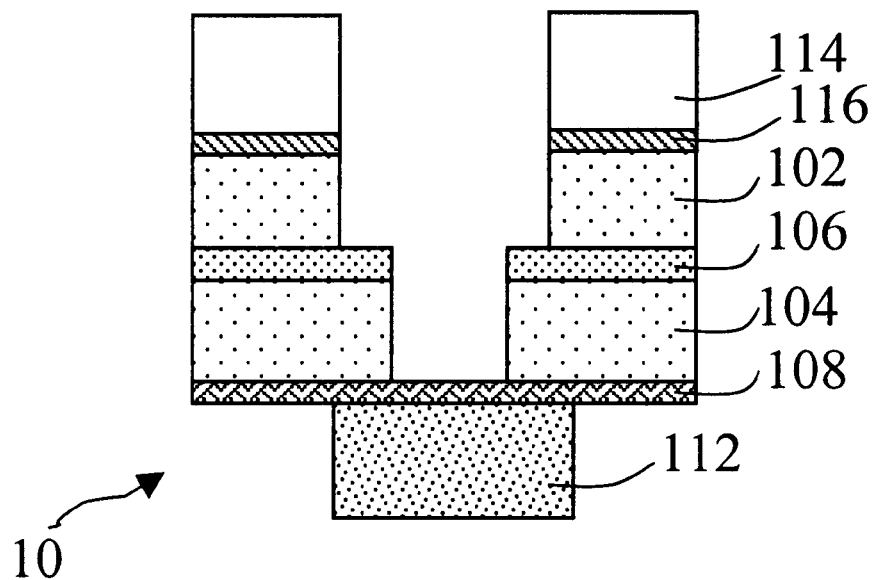
Figure 1C:
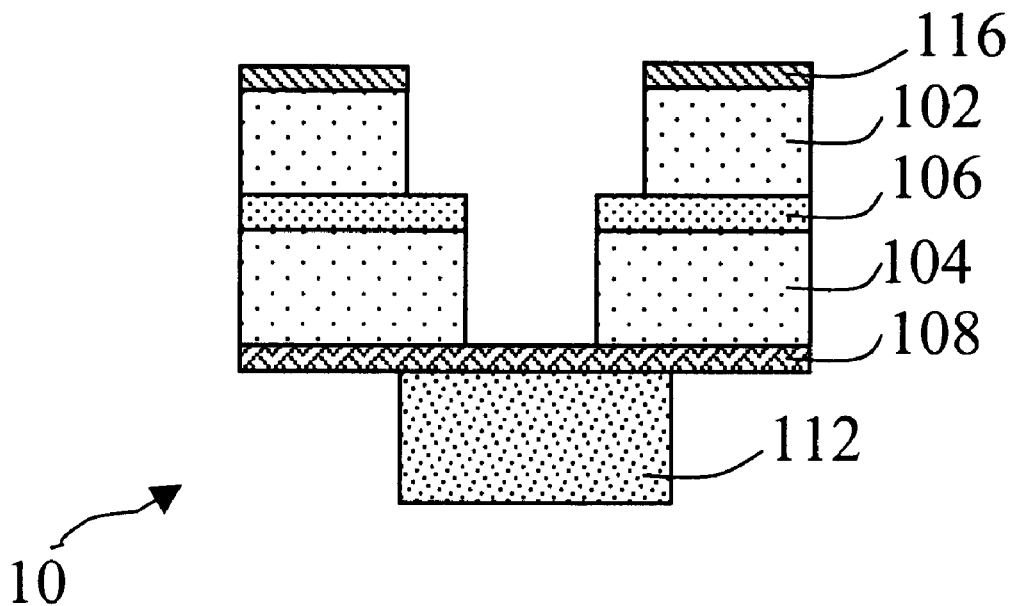
Figure 1D:
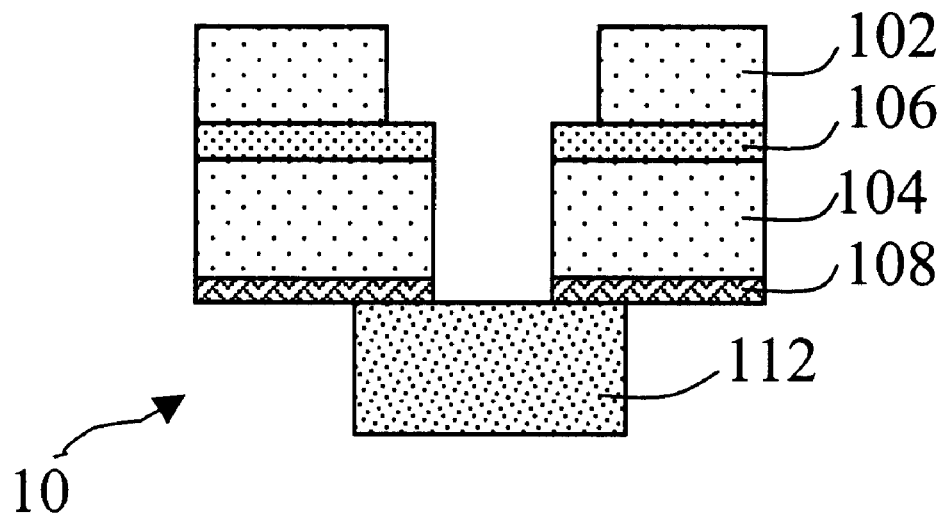
Figure 2A:
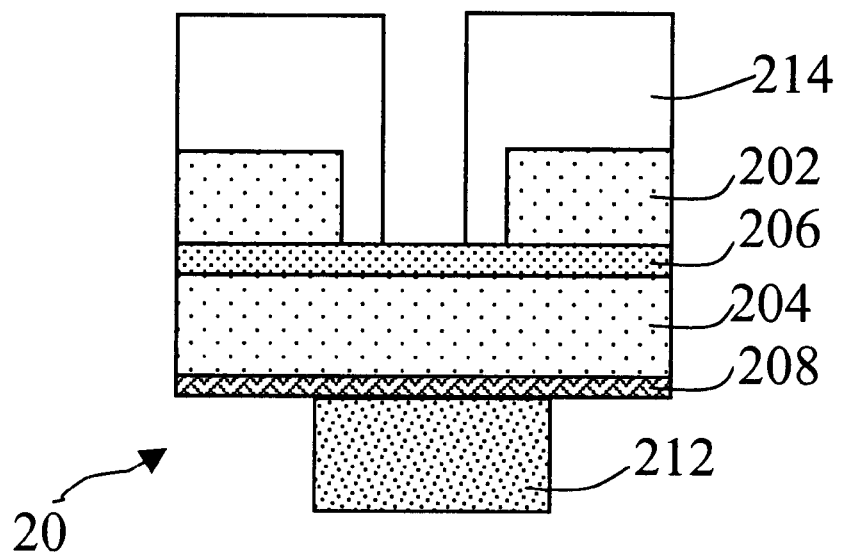
FIG. 2(a) to FIG. 2(d) illustrates a known "trench first" dual damascene etching process.
Figure 2B:
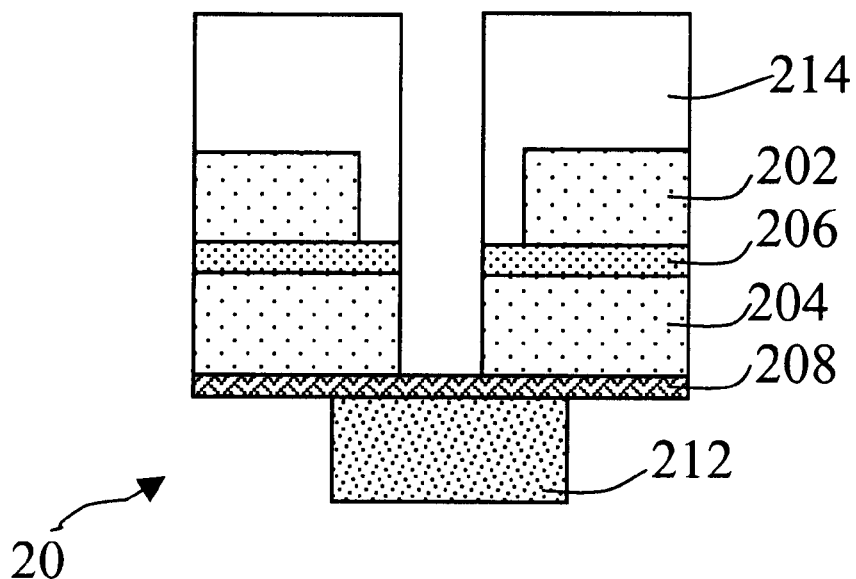
Figure 2C:
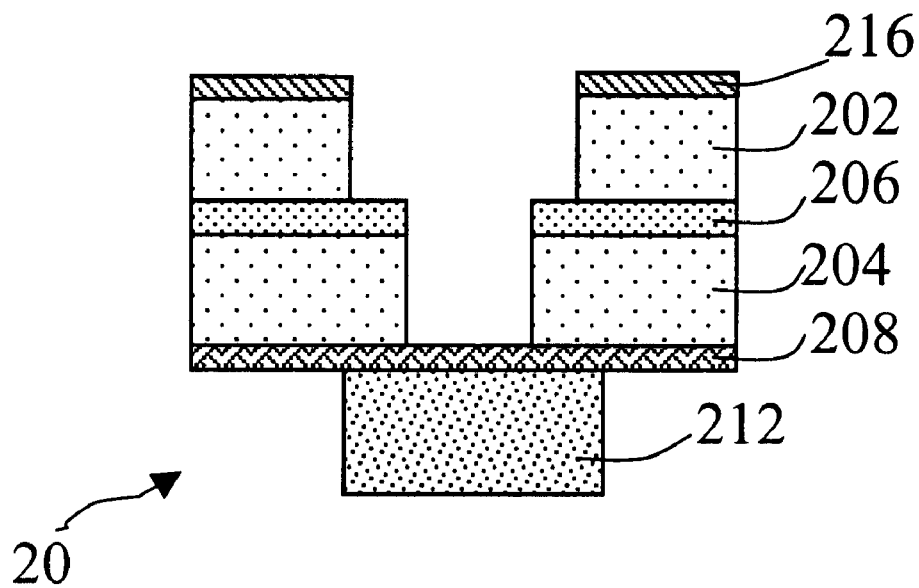
Figure 2D:
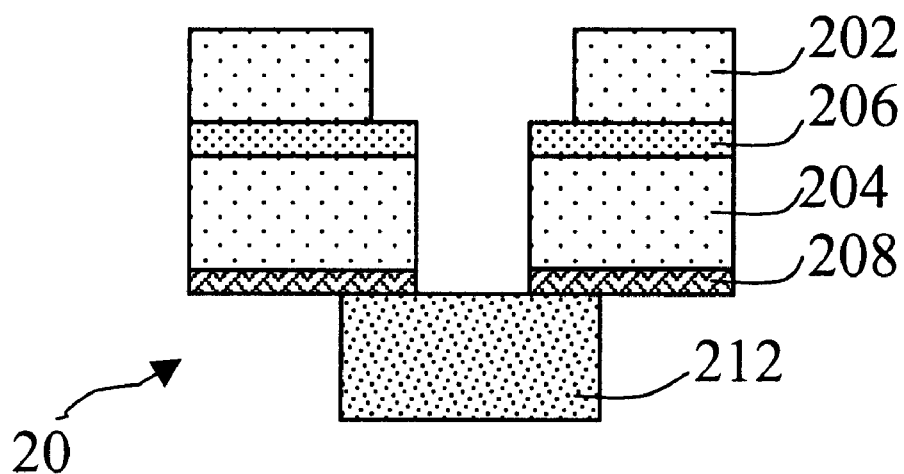
Figure 3A:
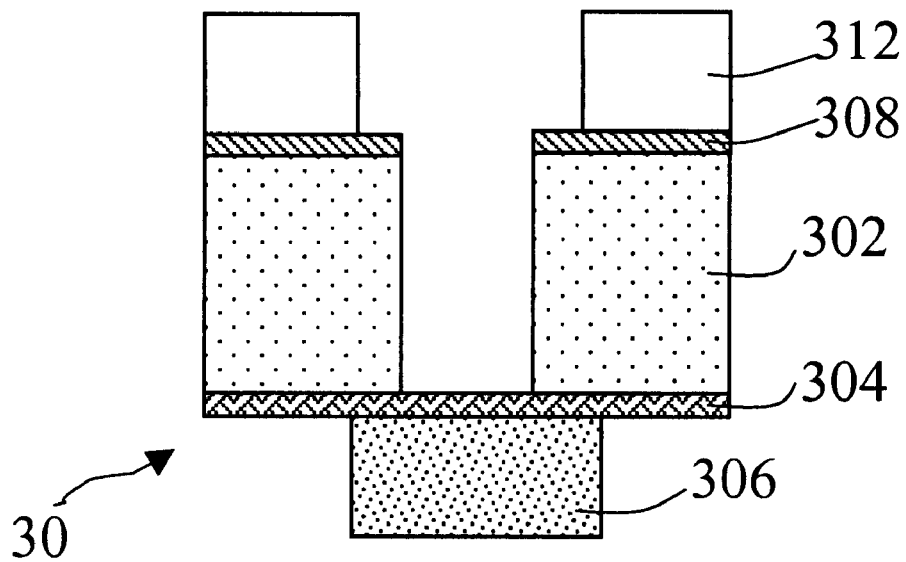
FIG. 3(a) to FIG. 3(e) illustrates a known "no etch stop layer" dual damascene etching process.
Figure 3B:
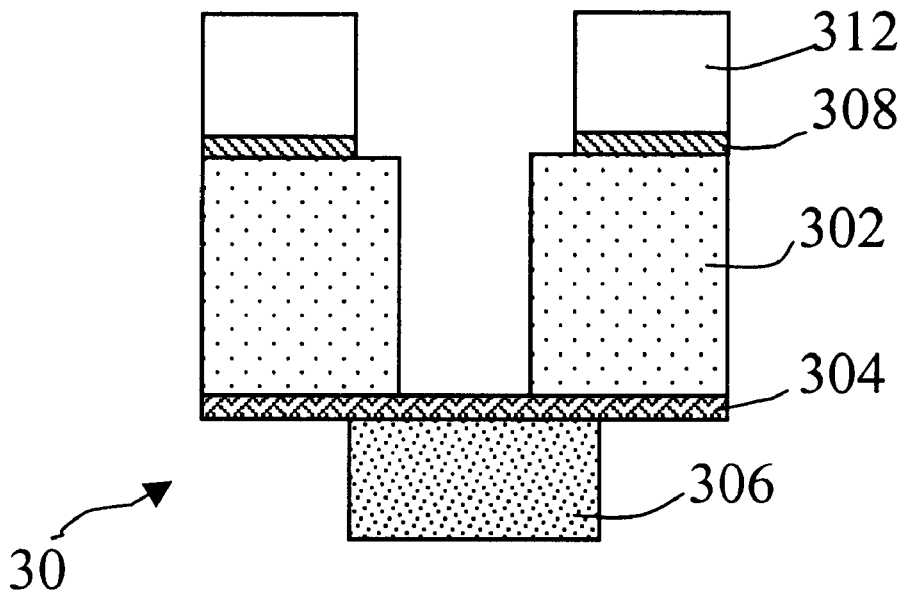
Figure 3C:
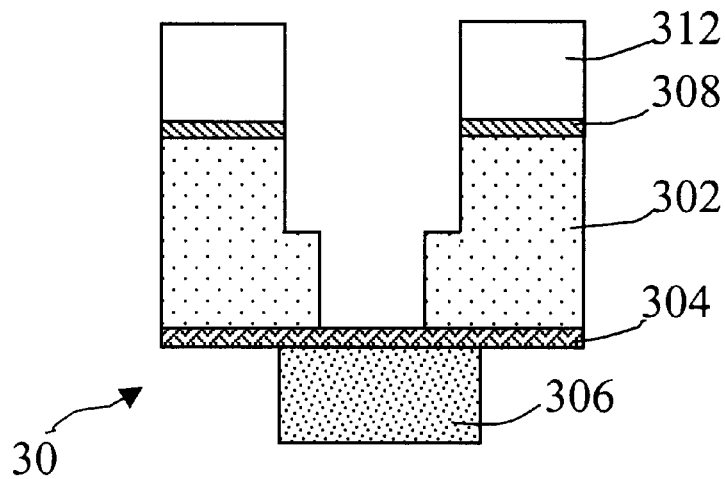
Figure 3D:
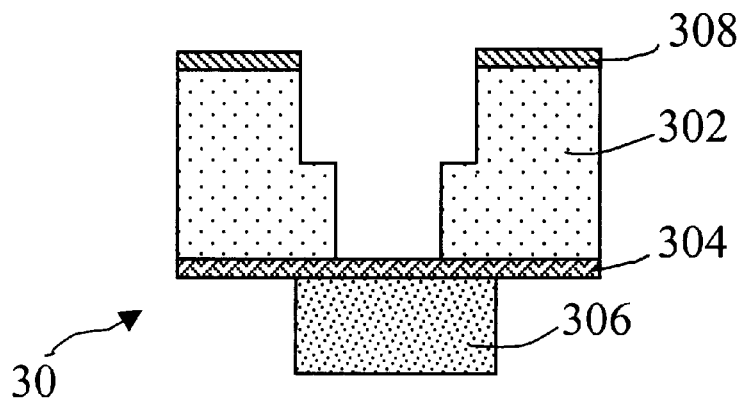
Figure 3E:
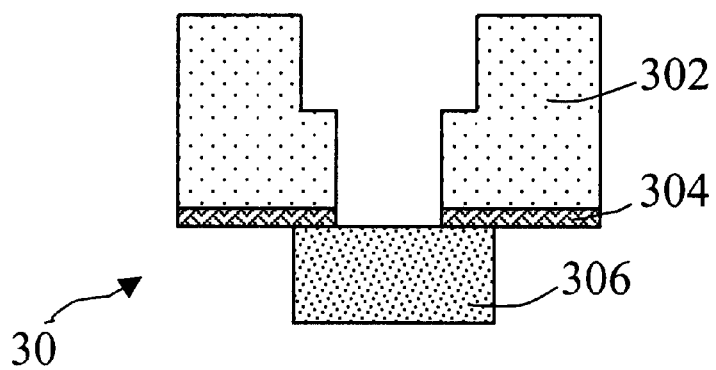
Figure 4:
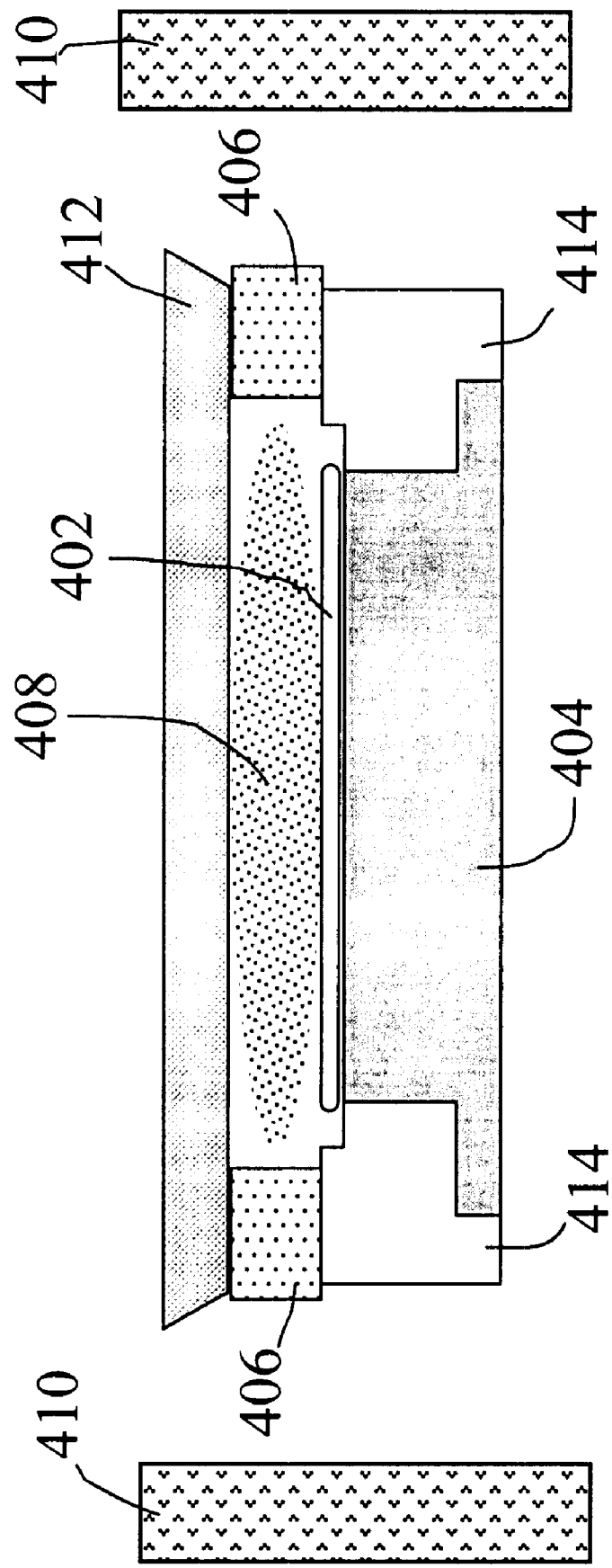
FIG. 4 illustrates the confined plasma chamber in accordance with the present invention.

The confined plasma chamber in accordance with the present invention is shown in FIG. 4. A wafer 402 is located on an electrostatic chuck (ESC) 404 of a confined plasma chamber 40. A quartz ring 406 surrounds the wafer 402 as a confinement ring to prevent the contact of plasma 408 generated during etching and the inner wall 410 of the confined plasma chamber 40. A silicon plate 412 constitutes the upper electrode of the confined plasma chamber 40. An edge ring 414, made of silicon and located beneath the quartz ring 406, together with the silicon plate 412 and the quartz ring 406 constitute a closed room to confine the plasma 408. Additionally, the edge ring 414 can increase the selectivity at the edge of the wafer 402.

The present invention is conducted under clean mode. Ideally, there is no polymer deposition in the confined plasma chamber 40, so the photoresist can be directly stripped by oxygen plasma in the chamber 40, i.e. in-situ photoresist stripping, and polymer residue in the confined plasma chamber 40 can be removed simultaneously. Moreover, a waferless auto-clean (WAC) step can be added after wafer is etched and exits the confined plasma chamber 40 to clean the process kits in the confined plasma chamber 40. Due to the capability of in-site photoresist stripping in the confined plasma chamber 40, the wafer needs not be transferred to other tool for processing. Thus, all the steps in the dual damascene etching process can be continuously performed in the confined plasma chamber 40.

Figure 5A:
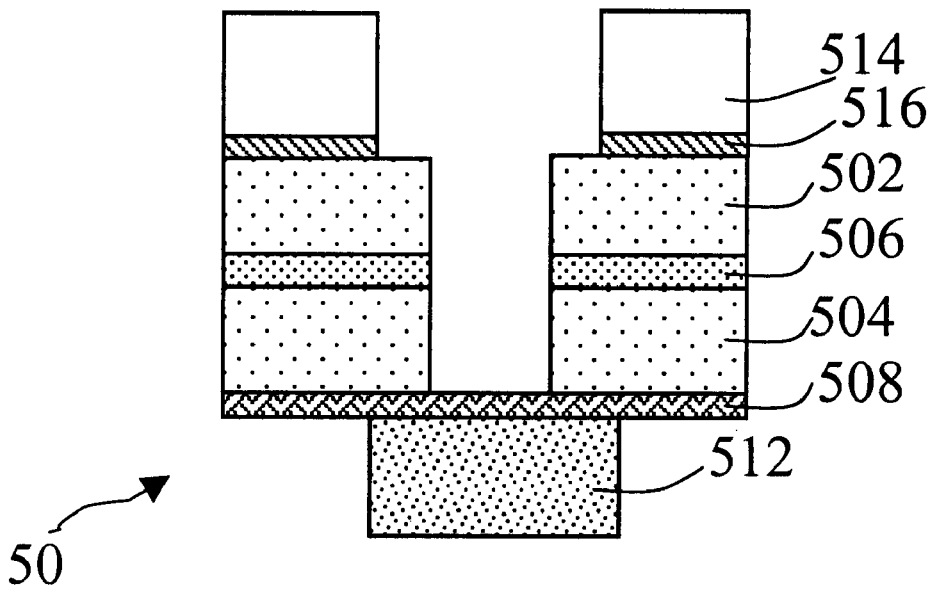
FIG. 5(a) to FIG. 5(d) illustrate a dual damascene etching process in the confined plasma chamber in accordance with the present chamber.
Figure 5B:
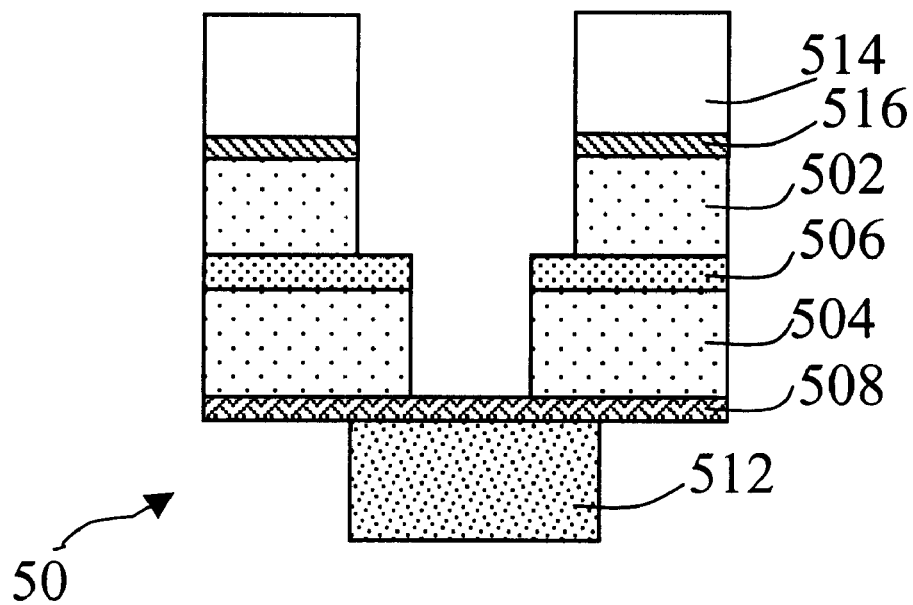
Figure 5C:
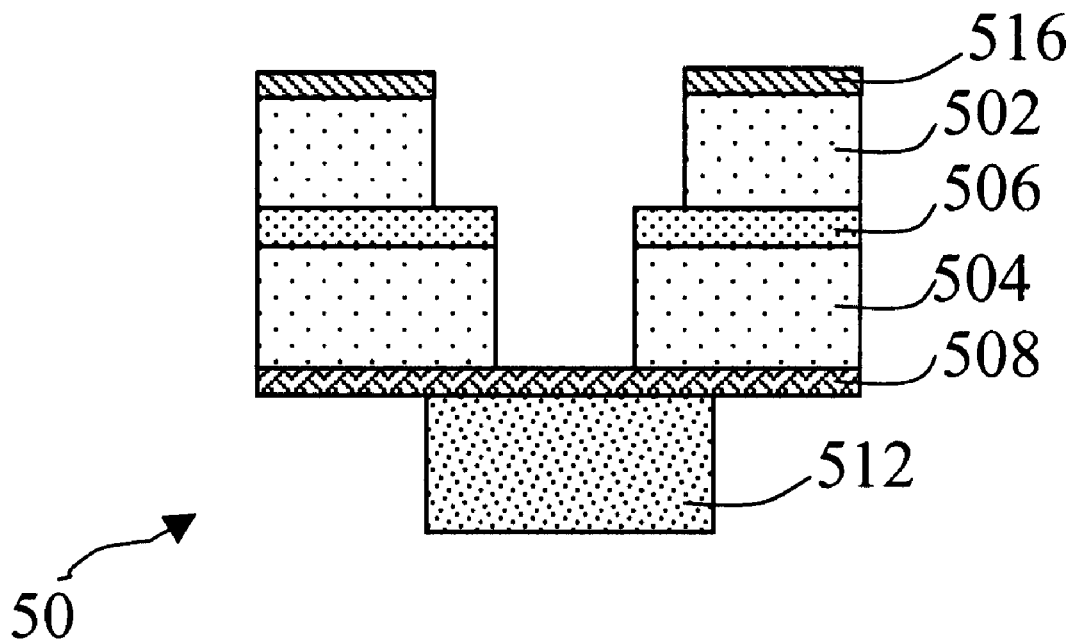
Figure 5D:
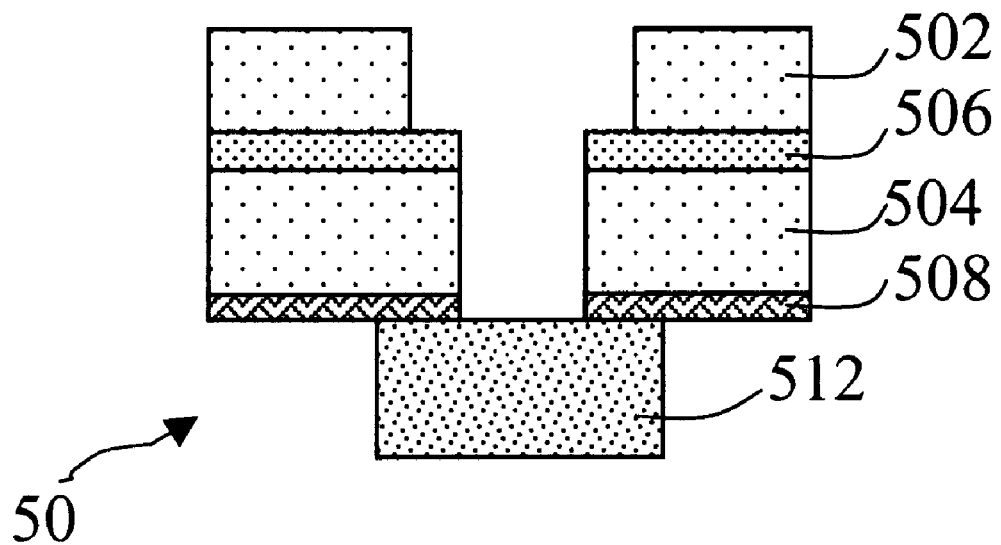

FIG. 5(a) to FIG. 5(d) illustrate the dual damascene etching process applied in the confined plasma chamber in accordance with the present invention, wherein all the steps are performed in the confined plasma chamber 40. In FIG. 5(a), a semiconductor device 50 having a via hole comprises an IMD 502, an etch stop layer 506, another IMD 504, a barrier layer 508, a metal line 512, a photoresist layer 514 and a hard mask 516. Both the IMD 502 and 504 are composed of dielectric material. The etch stop layer 506, the barrier layer 508 and the hard mask 516 can be a film of $Si_3N_4$, SiC or SiON. In FIG. 5(b), the IMD 502 is etched by a C—F based mixed plasma, such as $CF_4$, $CHF_3$, $C_4F_8$, until the etch stop layer 506 is reached. The opening in the IMD 502 is a trench. In FIG. 5(c), the photoresist layer 514 is etched by oxygen mixed plasma. $CF_4$ gas can also be added to enhance the capability of polymer stripping. In FIG. 5(d), finally a dual damascene structure is formed by etching the barrier layer 508 and the hard mask 516 with $CF_4$ based mixed plasma. It should be noted that, the sequence of the step of stripping the photoresist layer 514 and the step of removing the barrier layer 508 and the hard mask 516 can be switched to meet process requirement. In such case, the hard mask 516 is unnecessary, and the photoresist layer 514 may directly use as the mask for the barrier layer 508 etching.

Figure 6A:
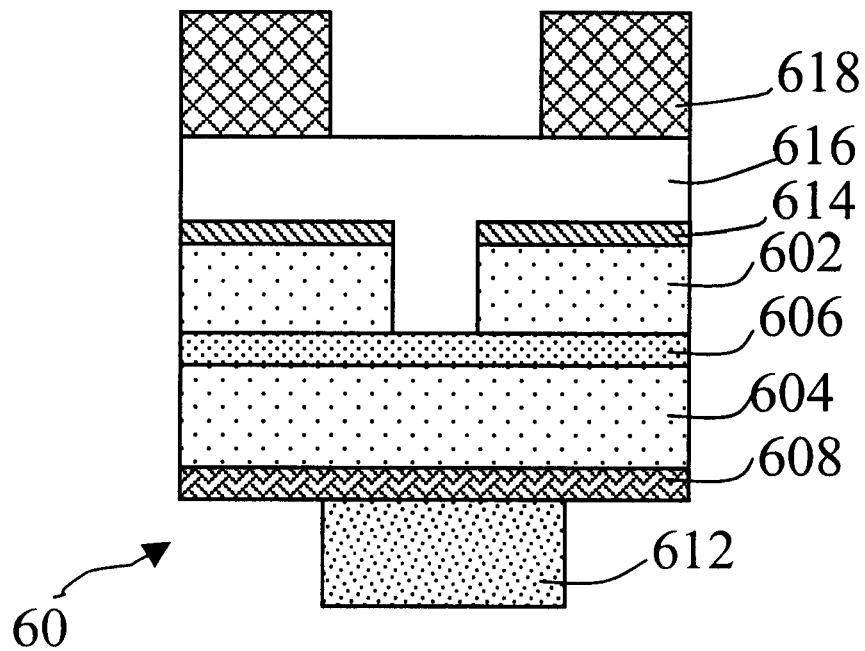
FIG. 6(a) to FIG. 6(f) illustrate another dual damascene etching process in the confined plasma chamber in accordance with the present chamber.
Figure 6B:
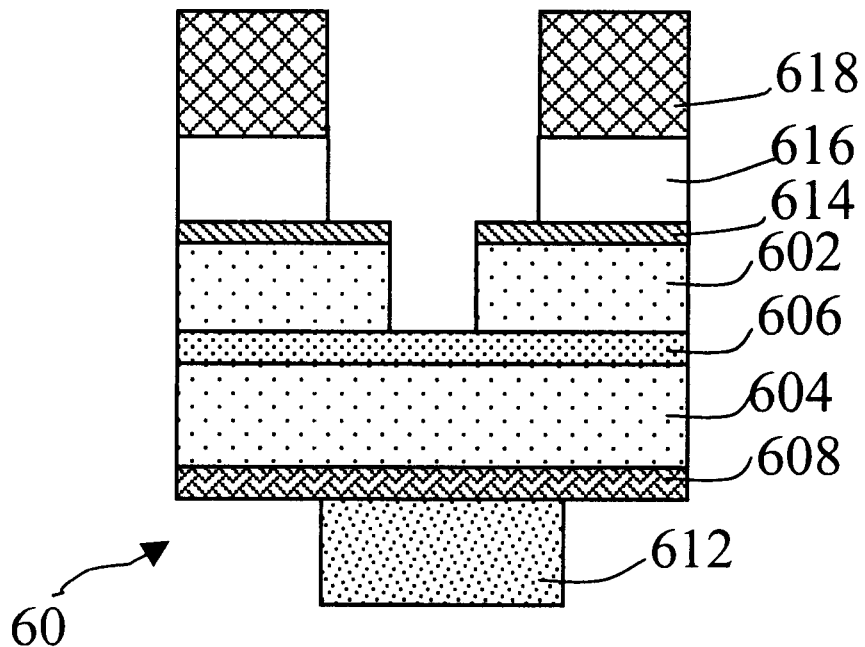
Figure 6C:
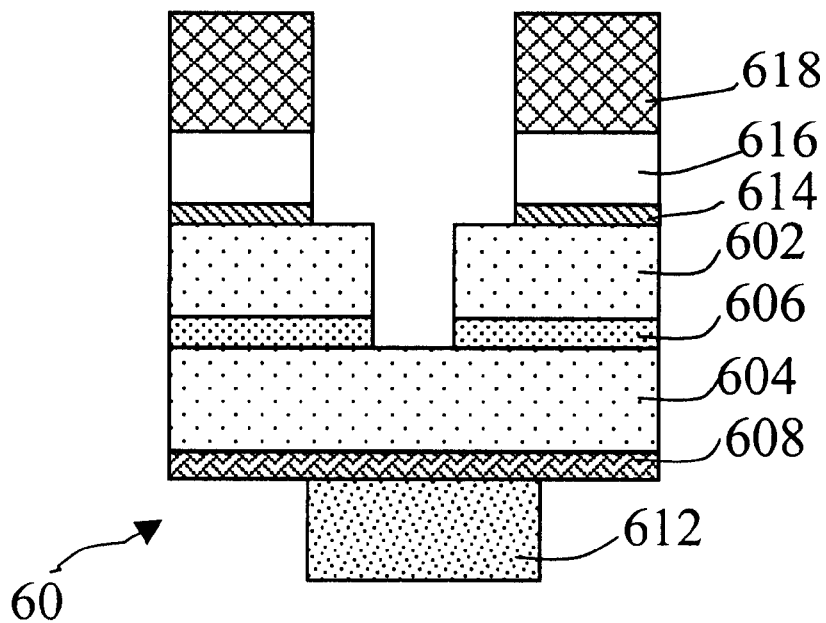
Figure 6D:
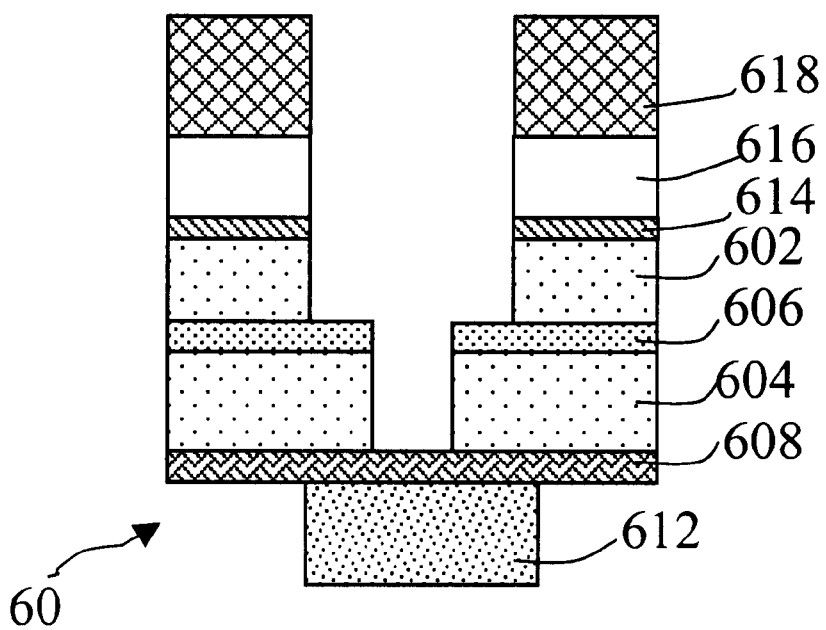
Figure 6E:
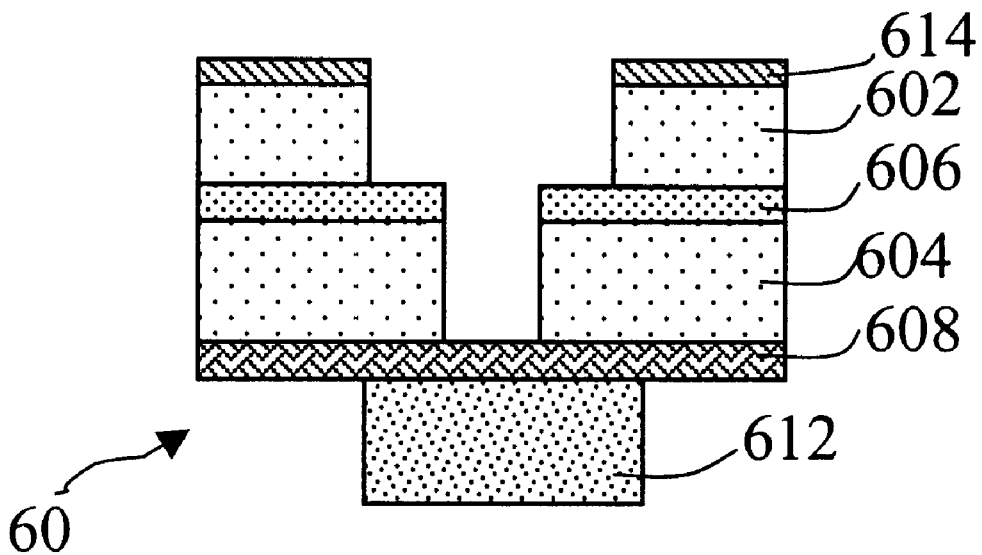
Figure 6F:
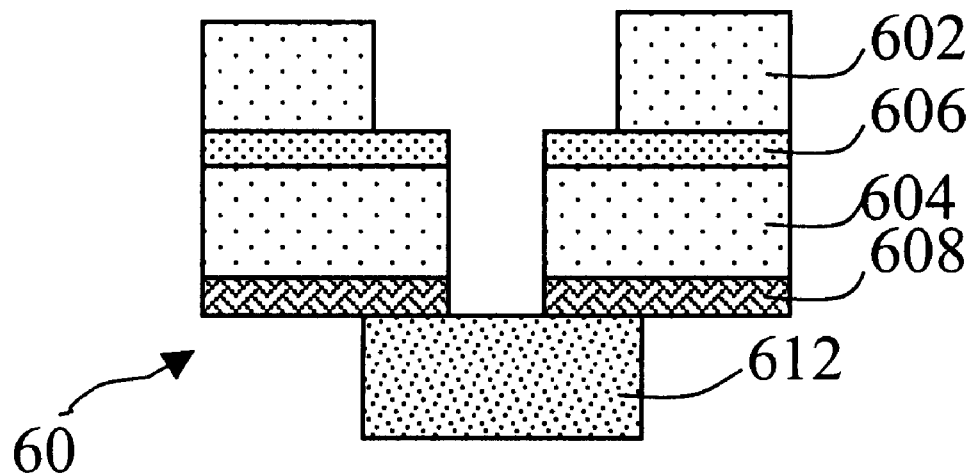

FIG. 6(a) to FIG. 6(d) illustrate another dual damascene etching process in the confined plasma chamber in accordance with the present invention to solve the insufficient photoresist selectivity problem during etching, wherein all the steps are continuously performed in the confined plasma chamber. Referring to FIG. 6(a), a semiconductor device 60 with a semi-completed via hole is provided. The semiconductor device 60 comprises IMD 602 and 604, an etch stop layer 606, a barrier layer 608, a metal line 612, a hard mask 614, a photoresist layer 616 and a silicon-containing photoresist layer 618. In FIG. 6(b), the photoresist layer 616 is etched by oxygen and nitrogen mixed plasma to define the required pattern of a trench and a via hole, which can be used to replace the development step in the lithography process. In FIG. 6(c), the etch stop layer 606 and the hard mask 614 are etched by $CF_4$ based mixed plasma. In FIG. 6(d), the IMD 602 and 604 are etched by $CF_4$, $CHF_3$ or $C_4F_8$ based mixed plasma to form the via hole and the trench structure. In FIG. 6(e), the silicon-containing photoresist layer 618 and the; photoresist layer 616 are sequentially removed by C—F and oxygen based mixed plasma. In FIG. 6(f), the barrier layer 608 and the hard mask 614 are removed by the $CF_4$ based plasma, and then the dual damascene structure is formed.

Besides the above-mentioned embodiments, all varieties of dual damascene process, such as "trench first" and "no etch stop layer", can be applied with the integrated dual damascene dielectric etching process in accordance with the present invention in the same confined plasma chamber as well.

The above-described embodiments of the present invention are intended to be illustrative only. Numerous alternative embodiments may be devised by those skilled in the art without departing from the scope of the following claims.

What is claimed is:

1. A semiconductor dual damascene etching process in a confined plasma chamber being in a clean mode and including a confinement ring and an anti-etching upper electrode plate, said semiconductor dual damascene etching process comprising the steps of:

providing a wafer having a via hole, an intermetal dielectric layer, a metal line, a barrier layer and a photoresist layer for defining a trench pattern, said wafer being placed in a space enclosed by said confinement ring and said upper electrode plate;

etching said intermetal dielectric layer to form said trench;

stripping said photoresist layer and cleaning said confined plasma chamber simultaneously by plasma; and etching said barrier layer to have said via hole in contact with said metal line beneath said barrier layer.

2. The semiconductor dual damascene etching process of claim 1, further comprising a step of etching a hard mask.

3. The semiconductor dual damascene etching process of claim 1, wherein said photoresist layer is a silicon-containing photoresist.

4. The semiconductor dual damascene etching process of claim 1, further comprising a clean step to remove a residual polymer in said confined plasma chamber after said wafer is away from said confined plasma chamber.

5. The semiconductor dual damascene etching process of claim 4, wherein said clean step is to use oxygen plasma.

6. The semiconductor dual damascene etching process of claim 4, wherein said clean step uses mixed plasma containing oxygen and $CF_4$.

7. The semiconductor dual damascene etching process of claim 1, wherein said confinement ring is made of quartz.

8. The semiconductor dual damascene etching process of claim 1, wherein said upper electrode plate is made of silicon.

9. The semiconductor dual damascene etching process of claim 1, wherein said intermetal dielectric layer is etched by C—F based plasma.

10. The semiconductor dual damascene etching process of claim 1, wherein said plasma is oxygen plasma.

11. The semiconductor dual damascene etching process of claim 1, wherein said plasma is mixed plasma containing oxygen and $CF_4$.

12. The semiconductor dual damascene etching process of claim 1, wherein said barrier layer is etched by $CF_4$ based mixed plasma.

13. A semiconductor dual damascene etching process in a confined plasma chamber being in a clean mode and including a confinement ring and an anti-etching upper electrode plate, said semiconductor dual damascene etching process comprising the steps of:

providing a wafer having a trench, an intermetal dielectric layer, a metal line, a barrier layer and a photoresist layer for defining a via hole pattern, said wafer being placed in a space enclosed by said confinement ring and said upper electrode plate;

etching said intermetal dielectric layer to form said via hole;

stripping said photoresist layer and cleaning said confined plasma chamber simultaneously by plasma; and etching said barrier layer to have said via hole in contact with said metal line beneath said barrier layer.

14. The semiconductor dual damascene etching process of claim 13, further comprising a clean step to remove a residual polymer in said confined plasma chamber after said wafer is away from said confined plasma chamber.

15. The semiconductor dual damascene etching process of claim 14, wherein said clean step is to use oxygen plasma.

16. A semiconductor dual damascene etching process in a confined plasma chamber being in clean mode and including a confinement ring and an anti-etching upper electrode plate, said semiconductor dual damascene etching process comprises the steps of:

providing a wafer having an intermetal dielectric layer, a metal line, a barrier layer and a photoresist layer for defining a trench pattern, said wafer being placed in a space enclosed by said confinement ring and said upper electrode plate;

etching said intermetal dielectric layer to form said trench and said via hole;

stripping said photoresist layer and cleaning said confined plasma chamber simultaneously by plasma;

etching said barrier layer to have said via hole in contact with said metal line beneath said barrier layer.

17. The semiconductor dual damascene etching process of claim 16, further comprising a clean step to remove a residual polymer in said confined plasma chamber after said wafer is away from said confined plasma chamber.

18. The semiconductor dual damascene etching process of claim 17, wherein said clean step is to use oxygen plasma.

* * * * *